United States Patent
Takeyama et al.

(10) Patent No.: US 6,664,597 B2
(45) Date of Patent: Dec. 16, 2003

(54) SUBSTRATE FOR MOUNTING A SEMICONDUCTOR ELEMENT THEREON AND SEMICONDUCTOR DEVICE COMPRISING A SEMICONDUCTOR ELEMENT MOUNTED ON SAID SUBSTRATE

(75) Inventors: Yoshifumi Takeyama, Kyoto (JP); Ichiro Kataoka, Nara (JP); Satoru Yamada, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 64 days.

(21) Appl. No.: 10/025,561

(22) Filed: Dec. 26, 2001

(65) Prior Publication Data

US 2002/0167064 A1 Nov. 14, 2002

(30) Foreign Application Priority Data

Dec. 26, 2000 (JP) ........................ 2000-395152

(51) Int. Cl.⁷ .......................... H01L 27/01; H01L 27/12
(52) U.S. Cl. ........................ 257/347; 257/352
(58) Field of Search ................. 257/347, 352–354

(56) References Cited

U.S. PATENT DOCUMENTS

| | | | |
|---|---|---|---|
| 5,157,537 A | * 10/1992 | Rosenblatt | 359/245 |
| 5,252,141 A | 10/1993 | Inoue et al. | 136/251 |
| 5,460,659 A | 10/1995 | Krut | 136/246 |
| 5,480,494 A | 1/1996 | Inoue | 136/251 |
| 6,049,109 A | * 4/2000 | Omura et al. | 257/347 |
| 6,049,135 A | * 4/2000 | Koike | 257/780 |
| 6,215,060 B1 | 4/2001 | Komori et al. | 136/251 |
| 6,245,987 B1 | 6/2001 | Shiomi et al. | 136/244 |

FOREIGN PATENT DOCUMENTS

| | | | | |
|---|---|---|---|---|
| JP | 53-117386 | 10/1978 | | |
| JP | 58-32072 | 2/1983 | | |
| JP | 62147387 A | * 7/1987 | | G01T/1/24 |
| JP | 5-82820 | 4/1993 | | |
| JP | 7-131048 | 5/1995 | | |
| JP | 7-231111 | 8/1995 | | |
| JP | 8-177187 | 7/1996 | | |
| JP | 9-83003 | 3/1997 | | |
| JP | 9-83006 | 3/1997 | | |
| JP | 11-97727 | 4/1999 | | |

* cited by examiner

Primary Examiner—Allan R. Wilson
(74) Attorney, Agent, or Firm—Fitzpatrick, Cella, Harper & Scinto

(57) ABSTRACT

A retaining substrate for mounting a semiconductor element thereon, having a circuit pattern for said semiconductor element, characterized in that said substrate comprises an insulative material, said substrate has a surface configuration having a cross section comprising (a) an uneven shaped portion and (b) a concave shaped portion which are arranged in tandem wherein a surface of said uneven shaped portion (a) makes a bottom face of said concave portion (b), and said uneven shaped portion (a) has a structure in that (a-i) an insulative convex shaped portion and (a-ii) an insulative concave shaped portion are alternately arranged so as to neighbor with each other, and said circuit pattern is provided in said concave shaped portion (a-ii) of said uneven shaped portion (a).

9 Claims, 5 Drawing Sheets

SUBSTRATE FOR MOUNTING A SEMICONDUCTOR ELEMENT THEREON AND SEMICONDUCTOR DEVICE COMPRISING A SEMICONDUCTOR ELEMENT MOUNTED ON SAID SUBSTRATE

BACKGROUND OF THE INVENTION

1. Field of the Invention

The present invention relates to a retaining substrate for mounting a semiconductor element thereon and a semiconductor device in which said substrate is used. More particularly, the present invention relates to a insulative retaining substrate for mounting a semiconductor element thereon and which has a function of efficiently performing heat radiation for said semiconductor element mounted thereon and a semiconductor device comprising a semiconductor element mounted on said insulative substrate.

2. Related Background Art

In recent years, the global warming of the earth because of the so-called greenhouse effect to an increase in the content of $CO_2$ gas in the air has been predicted.

In view of this, there is an increased demand for the development of clean energy sources with no accompaniment of $CO_2$ gas exhaustion. As one of such clean energy sources, there can be mentioned atomic power generation. However, for the atomic power generation, there are problems which are difficult to be solved, such as radioactive wastes and the like which cause air pollution. Also in view of this, there is an increased demand for providing clean energy sources which are highly safe and do not exhaust air-polluting substances.

Under these circumstances, public attention has now focused on a solar cell which converts sunlight into electric energy as a clean energy source, because it does not exhaust contaminants and it is safe and can be readily handled.

As such solar cell, there are known have a variety of solar cells. And some of them have been using as power generation sources in practice. These solar cells include crystalline series solar cells in which single crystal silicon material or polycrystal silicon material is used, amorphous series solar cells in which amorphous silicon material is used, and compound semiconductor series solar cells in which compound semiconductor material is used. Besides, there are known a variety of configurations for these solar cells to be practically used. Specifically, there are known, for instance, a frame type solar cell as disclosed in Japanese Unexamined Patent Publication No. 82820/1993, a frame-less type solar cell as disclosed in Japanese Unexamined Patent Publication No. 131048/1995, a roofing material-integral type solar cell as disclosed in disclosed in Japanese Unexamined Patent Publication No. 177187/1996 or Japanese Unexamined Patent Publication No. 97727/1999, and an optical-concentration type solar cell as disclosed in Japanese Unexamined Patent Publication No. 83006/1997.

For any of these solar cells, the material cost of the cell (the photoelectric conversion element) constituting the solar cell accounts for the largest rate of the cost of the solar cell. Thus, in order to reduce the cost of the solar cell, it is an important factor to diminish the use amount of the material constituting the cell (the photoelectric conversion element). The optical-concentration type solar cell is of the configuration in that in order to reduce the power generation cost by making full use of the ability of a photoelectric conversion element (a cell) used therein which is costly, sunlight is converged and condensed to several times to several hundreds times by means of a condenser lens to increase the quantity of incident light to the photoelectric conversion element, whereby diminishing the use amount of the photoelectric conversion element.

Specifically, the optical-concentration type solar cell disclosed in Japanese Unexamined Patent Publication No. 83006/1997 is of the configuration in that a solar cell comprising a compound semiconductor material such as GaAs or the like is arranged on a retaining substrate constituted by glass, resin or ceramics, a reverse taper-like concaved portion whose open area being upward widened is arranged above the solar cell, and a light-converging structural body with a high refraction factor and which comprises a resin such as polystyrene and has a surface processed into a lens-like form is accommodated in said concaved portion. Separately, Japanese Unexamined Patent Publication No. 231111/1995 discloses a substrate for an optical-concentration type solar cell. This substrate has a structure in that a plurality of small solar cells are connected respectively to a standard IC-type carrier comprising a dual in-line package or the like and the carriers are attached to a print substrate comprising a throughhole substrate or the like to establish electrical connection between the carriers.

For these solar cells, there is a drawback such that when the temperature of the solar cell is increased, the photoelectric conversion efficiency (the power generation efficiency) is deteriorated. In order to solve such problem, Japanese Unexamined Patent Publication No. 83003/1997 proposes a method in that for a solar cell formed on a substrate, a cooling fin is provided at a said substrate and a ventilation trunk is formed at said substrate to prevent the temperature of the solar cell from being raised.

This cooling method is effective when the solar cell is installed in an environmental atmosphere whose temperature is not remarkably increased. However, in the case of an optical-concentration solar cell, as the light condensation magnitude is increased, the temperature of the solar cell is extremely increased. And it is difficult to sufficiently prevent the extreme temperature rising of the solar cell in this case by aforesaid cooling method.

Detailed description will be made of this point with reference to the drawings.

FIGS. 3(a) to 3(d) are schematic views illustrating the structure of an example of an optical-concentration type solar cell comprising a single crystal silicon material.

Particularly, FIG. 3(a) is a schematic plane view illustrating an appearance of a light receiving face side of the optical-concentration type solar cell, FIG. 3(b) is a schematic view illustrating an appearance of a first side face of the optical-concentration type solar cell, FIG. 3(c) is a schematic view illustrating an appearance of a second side face of the optical-concentration type solar cell, and FIG. 3(d) is a schematic plane view illustrating an appearance of a non-light receiving face side of the optical-concentration type solar cell.

In FIGS. 3(a) to 3(d), reference numeral 1 indicates a photovoltaic element constituted by a single crystal silicon material, and reference numerals 2 and 3 a pair of output electrodes of the photovoltaic element, which are provided on the non-light receiving face side as shown in FIG. 3(d).

In the inside of the photovoltaic element, there is provided a photoelectric conversion semiconductor layer having a plurality of p-n junction structures formed by alternately stacking a p-type semiconductor layer and an n-type semiconductor layer as shown in FIG. 4, where a p-type layer electrode 41 is electrically connected to each p-type semiconductor layer, and an n-type layer electrode 42 is electrically connected to each n-type semiconductor layer. The p-type electrode layers 41 are electrically connected to one of the two output electrodes 2 and 3 of the photovoltaic element and the n-type electrode layers 42 are electrically connected to the other output electrode of the photovoltaic element.

FIGS. 5(a) to 5(d) are schematic views illustrating the structure of an example of an optical-concentration type solar cell comprising a single crystal silicon material and in which light convergence is performed by means of a Fresnel lens.

Particularly, FIG. 5(a) is a schematic plane view illustrating an appearance of a light receiving face side (the light receiving face having a reflection preventive film 51) of the optical-concentration type solar cell, FIG. 5(b) is a schematic view illustrating an appearance of a first side face of the optical-concentration type solar cell, FIG. 5(c) is a schematic view illustrating an appearance of a second side face of the optical-concentration type solar cell, and FIG. 5(d) is a schematic plane view illustrating an appearance of a non-light receiving face side of the optical-concentration type solar cell.

In FIGS. 5(a) to 5(d), reference numeral 1 indicates a photovoltaic element constituted by a single crystal silicon material. On a surface region of the front surface of the photovoltaic element 1 where converged light is irradiated; a reflection preventive film 51 in a round form is provided. Reference numerals 2 and 3 indicate a pair of output electrodes which are provided on the non-light receiving face side of the photovoltaic element as shown in FIG. 5(d).

As well as in the case of the photovoltaic element shown in FIGS. 3(a) to 3(d), in the inside of the photovoltaic element, there are provided a plurality of photoelectric conversion semiconductor layers having a plurality of p-n junction structures formed by alternately stacking a p-type semiconductor layer and an n-type semiconductor layer, where a p-type layer electrode is electrically connected to each p-type semiconductor layer, and an n-type layer electrode is electrically connected to each n-type semiconductor layer. The p-type electrode layers are electrically connected to one of the two output electrodes 2 and 3 and the n-type electrode layers are electrically connected to the other output electrode.

In such optical-concentration type solar cell having such configuration as shown in FIG. 3 [FIGS. 3(a) to 3(d)] or FIG. 5 [FIGS. 5(a) to 5(d)], it is required that converged light is effectively irradiated to the photovoltaic element in the solar cell. In order to satisfy this requirement, it is necessary that the active area of the solar cell is brought unlimitedly near 100%. In view of this, the output electrodes extending from the photovoltaic element in the solar cell are provided on the non-light receiving face side of the solar cell.

The optical-concentration type solar cell having the output electrodes on the non-light receiving face side as above described is mounted on a retaining substrate constituted by glass, resin, ceramics or the like.

Description will be made of an example of such solar cell mounted on a retaining substrate with reference to FIG. 6 [FIGS. 6(a) to 6(c)]. FIG. 6(a) is a schematic view illustrating an appearance of an arrangement state in which a plurality of photovoltaic elements (solar cells) are arranged on such retaining substrate as above described while being serialized with each other, when viewed from above. FIG. 6(b) is a schematic view illustrating a circuit pattern provide on the retaining substrate, when viewed from the right receiving face side of the retaining substrate. FIG. 6(c) is a schematic cross-sectional view, taken along the line C—C' in FIG. 6(a). In FIGS. 6(a) to 6(c), reference numeral 5 indicates a retaining substrate made of ceramics and having a thickness of about 0.5 mm to about 1 mm. Reference numeral 4 indicates a circuit pattern made of copper and having a thickness of about 0.01 mm to about 1 mm, which is formed on the retaining substrate 5. Reference numeral 1 indicates a photovoltaic element (a solar cell) which is arranged on the circuit pattern 4. Upon arranging the photovoltaic element 1 on the circuit pattern 4, there is used a solder. Reference numeral 6 indicates a resist which is formed on the circuit pattern 4 in order to prevent the solder (which is used upon arranging the photovoltaic element 1 on the circuit pattern 4) from being flown to the outside and also in order to decide the arrangement position of the photovoltaic element 1 on the circuit pattern 4. The photovoltaic element 1 is arranged at a prescribed position on the circuit pattern 4 which is decided by the resist 6, and a first output electrode 2 and a second output electrode 3 of the photovoltaic element 1 are electrically connected to the circuit pattern by means of the solder. By the circuit pattern 4 formed on the retaining substrate 5 in this way, a power generated by the photovoltaic element 1 on the retaining substrate 5 is outputted to the outside through the first and second electrodes 2 and 3.

Incidentally, in an optical-concentration type solar cell having such structure as above described, incident sunlight is condensed to several times to several hundreds times by means of a condenser lens. Therefore, it is a general phenomenon that the temperature of a portion of the photovoltaic element in the optical-concentration type solar cell where the sunlight is condensed as above described is extremely increased to reach several hundreds centigrade (°C.) Thus, the materials used in the photovoltaic element and the structure of the photovoltaic element are required to have excellent heat-resistance and heat radiation characteristics.

In the above-described optical-concentration type solar cell, the positional relation between the retaining substrate 5 having the photovoltaic element mounted thereon and the condenser lens (not shown in the figure) are generally fixed, where in general, there will not be such an occasion that condensed incident sunlight is irradiated to other portion than the photovoltaic element under use environment.

However, for instance, upon performing the maintenance work, there is sometimes occurred necessity to correct the positional relation between the retaining substrate and the condenser lens. At that time, in the case where the positional relation is accidentally made such that condensed incident sunlight is irradiated to the resist 6, because a resin material comprising an epoxy resin or the like is generally used as the resist 6, when aforesaid condensed incident sunlight is irradiated to the resist 6, there will be an occasion in that the resist is markedly deteriorated or it is thermally decomposed to disappear in the worst case. In the case where the resist 6 used in the conventional retaining substrate as shown in FIG. 6 accomplishes its function particularly upon mounting the photovoltaic element on the retaining substrate and has substantially no necessity under use environment. However, there is a problem such that if the resist is thermally decomposed, refuses and the like are provided. In order to prevent the occurrence of this problem, there is considered a method in that the resist 6 is not provided in the retaining substrate 5. However, when this method is adopted, there will be occurred such problems as will be described in the following. For instance, in the case where the photovoltaic element is mounted on the retaining substrate using a reflow solder, the solder is flown out and along with this, the photovoltaic element is moved, where it is difficult to arrange the photovoltaic element at a prescribed position.

SUMMARY OF THE INVENTION

The present invention is aimed at solving the foregoing problems in the prior art and providing a retaining substrate for mounting a semiconductor element such as a photovoltaic element thereon, which makes it possible to effectively arrange a photovoltaic element at a prescribed position of the substrate without necessity of using such resist as used in the prior art upon mounting said photovoltaic element, and which has a function to effectively radiate heat of said photovoltaic element, and a semiconductor device comprising a semiconductor element mounted on said substrate.

Another object of the present invention is to provide a retaining substrate for mounting a semiconductor element thereon, having a circuit pattern for said semiconductor element, characterized in that said substrate comprises an insulative material, said substrate has a surface configuration having a cross section comprising (a) an uneven shaped portion and (b) a concave shaped portion which are arranged in tandem wherein a surface of said uneven shaped portion (a) makes a bottom face of said concave portion (b), and said uneven shaped portion (a) has a structure in that (a-i) an insulative convex shaped portion and (a-ii) an insulative concave shaped portion are alternately arranged so as to neighbor with each other, and said circuit pattern is provided in said concave shaped portion (a-ii) of said uneven shaped portion (a).

Specifically, the retaining substrate for mounting a semiconductor element thereon has the uneven shaped portion (a) having a structure in that the insulative convex shaped portion (a-i) and the isulative concave shaped portion (a-ii) are alternately arranged so as to neighbor with each other at a lower portion thereof and has the concave shaped portion (b) above the uneven shaped portion (a). In more detail, the uneven shaped portion (a) has a structure in that a plurality of insulative concave shaped portions (a-ii) each circumscribed by an insulative convex shaped portion (a-i) are arranged to neighbor with each other. A circuit pattern for a semiconductor element is provided in each insulative concave shaped portion (a-ii) and an electrode of a semiconductor element is arranged on the circuit pattern situated in the insulative concave shaped portion (a-ii) such that said electrode is close-contacted with the circuit pattern while being electrically connected with the circuit pattern where the insulative convex shaped portion (a-i) is present between each adjacent insulative concave shaped portions (a-ii). The semiconductor element is arranged in the concave shaped portion (b) situated above the uneven shaped portion (a), where the semiconductor element is close-contacted with the insulative convex shaped portion (a-i) of the uneven shaped portion (a) situated below the concave shaped portion (b) and simultaneously with this, the semiconductor element is close-contacted with the substrate body.

The retaining substrate of the present invention which has such specific structure as above described has significant advantages as will be described below.

It is possible to effectively and desirably mount a semiconductor element having an electrode on the substrate side thereof on the retaining substrate without using a resist (which is inferior in terms of the heat resistance) which is used in the prior art and while preventing occurrence of positional shift of the semiconductor element upon mounting it on the substrate.

It is also possible that heat of the semiconductor element is radiated to the insulative substrate to prevent the temperature of the semiconductor element from being increased. Thus, the characteristics of the semiconductor element are prevented from being deteriorated.

The retaining substrate is effective particularly in the case of a retaining substrate for mounting a semiconductor element thereon, which is heated to a temperature at which a resist is thermally decomposed. Specifically, the present invention is particularly advantageous to be applied in an optical-concentration type solar cell whose temperature is extremely raised due to an external factor by sunlight which is irradiated, where it is substantially impossible to use a resist, because the retaining substrate has excellent heat-radiating function, when the substrate is used as a retaining substrate of the optical-concentration type solar cell, the problems relating to temperature raise thereof can be effectively solved without using any cooling means.

The present invention also makes it a further object to provide a semiconductor device comprising an insulative substrate and a semiconductor element provided on said substrate, said semiconductor element having an electrode, characterized in that said substrate has an uneven shaped portion (a) in that an insulative convex shaped portion (a-i) and an isulative concave shaped portion (a-ii) are alternately arranged so as to neighbor with each other at a lower portion thereof and has a concave shaped portion (b) situated above said uneven shaped portion (a), a circuit pattern for said semiconductor element and said electrode of said semiconductor element are arranged in this order in said insulative concave shaped portion (a-ii) of said uneven shaped portion (a) such that said circuit pattern and said electrode are close-contacted with each other while being electrically connected with each other, and said semiconductor element is arranged in said concave shaped portion (b) situated above said uneven shaped portion (a) while being close-contacted with said insulative convex shaped portion (a-i) of said uneven shaped portion (a) and while being close-contacted with the substrate body.

DESCRIPTION OF THE INVENTION AND PREFERRED EMBODIMENTS

Figure 1A:
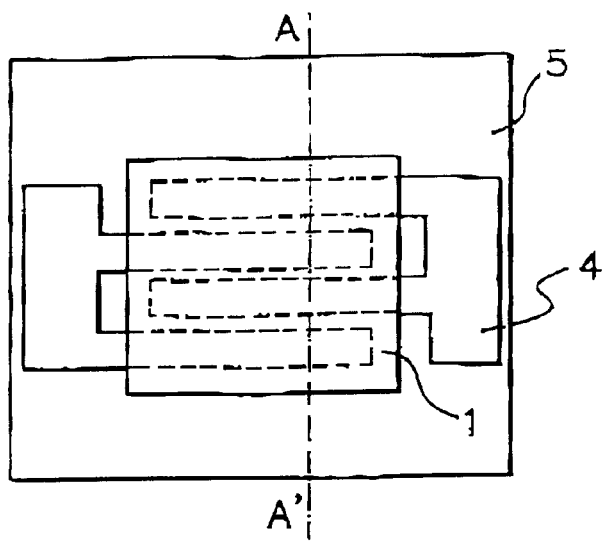
FIGS. 1(a) to 1(d) are schematic views illustrating an example of a retaining substrate for mounting a semiconductor element thereon and an example of a configuration in that said semiconductor element is mounted on said substrate, relating to Examples 1 and 2 which will be described later.
Figure 1B:
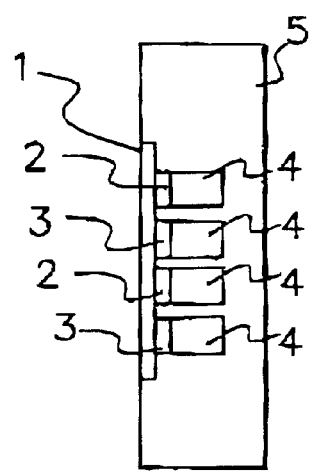
Figure 1C:
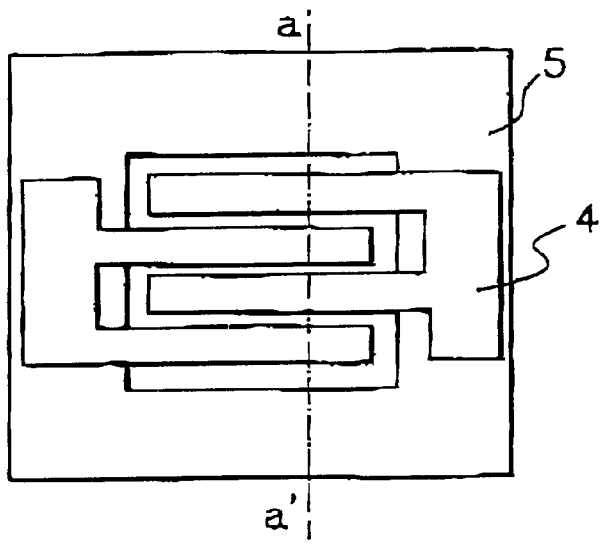
Figure 1D:
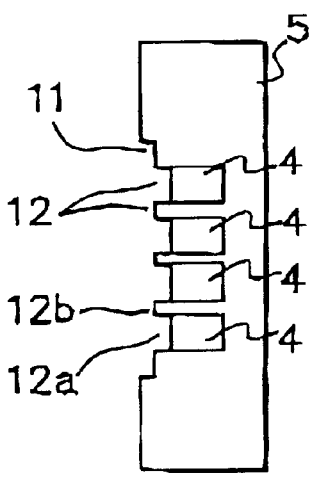

As previously described, the present invention includes two aspects, a first aspect relating to a retaining substrate for mounting a semiconductor element thereon and a second aspect relating to a semiconductor device mounted on said retaining substrate.

Particularly, a first aspect of the present invention is to provide a retaining substrate for mounting a semiconductor element thereon, having a circuit pattern for said semiconductor element thereon, characterized in that said substrate comprises an insulative material, said substrate has a surface configuration having a cross section comprising (a) an uneven shaped portion and (b) a concave shaped portion which are arranged in tandem wherein a surface of said uneven shaped portion (a) makes a bottom face of said concave portion (b), and said uneven shaped portion (a) has a constitution in that (a-i) an insulative convex shaped portion and (a-ii) an insulative concave shaped portion are alternately arranged so as to neighbor with each other, and said circuit pattern is provided in said concave shaped portion (a-ii) of said uneven shaped portion (a).

A second aspect of the present invention is to provide a semiconductor device comprising a insulative retaining substrate and a semiconductor element provided on said substrate, said semiconductor element having an electrode, characterized in that said substrate has an uneven shaped portion (a) in that an insulative convex shaped portion (a-i) and an isulative concave shaped portion (a-ii) are alternately arranged so as to neighbor with each other at a lower portion thereof and has a concave shaped portion (b) situated above said uneven shaped portion (a), a circuit pattern for said semiconductor element and said electrode of said semiconductor element are arranged in this order in said insulative concave shaped portion (a-ii) of said uneven shaped portion (a) such that said circuit pattern and said electrode are close-contacted with each other while being electrically connected with each other, and said semiconductor element is arranged in said concave shaped portion (b) situated above said uneven shaped portion (a) while being close-contacted with said insulative convex shaped portion (a-i) of said uneven shaped portion (a) and while being close-contacted with the substrate body.

In the first aspect of the present invention, the semiconductor element which is mounted on the retaining substrate has an electrode, said electrode is arranged in the concave shaped portion (a-ii) of the uneven shaped portion (a) such that the electrode is situated on the circuit pattern provided in the concave shaped portion (a-ii) so as to close-contact with and electrically connect with the circuit pattern and wherein the semiconductor element is arranged in the concave shaped portion (b) such that the semiconductor element is close-contacted with the insulative portion of the convex shaped portion (a-i) of the uneven shaped portion (a) and the semiconductor element is close-contacted with the substrate.

The retaining substrate having such specific structure as above described makes it possible to effectively and desirably mount a semiconductor element formed on a substrate and having an electrode on the substrate side thereof on the retaining substrate without using a resist as in the prior art and while preventing occurrence of positional shift of said semiconductor element upon amounting it on the substrate.

Specifically, the retaining substrate of the present invention has the uneven shaped portion (a) having a structure in that the insulative convex shaped portion (a-i) and the isulative concave shaped portion (a-ii) are alternately arranged so as to neighbor with each other, at a lower portion thereof and has the concave shaped portion (b) above the uneven shaped portion (a). In more detail, the uneven shaped portion (a) has a structure in that a plurality of insulative concave shaped portions (a-ii) each circumscribed by an insulative convex shaped portion (a-i) are arranged so as to neighbor with each other. A circuit pattern for a semiconductor element is provided in each insulative concave shaped portion (a-ii) and an electrode of a semiconductor element is arranged on the circuit pattern situated in the insulative concave shaped portion (a-ii) such that said electrode is close-contacted with the circuit pattern while being electrically connected with the circuit pattern, where the insulative convex shaped portion (a-i) is present between each adjacent insulative concave shaped portions (a-ii). The semiconductor element is arranged in the concave shaped portion (b) situated above the uneven shaped portion (a), where the semiconductor element is close-contacted with the insulative convex shaped portion (a-i) of the uneven shaped portion (a) situated below the concave shaped portion (b) and simultaneously with this, the semiconductor element is close-contacted with the substrate body. This makes it possible that heat of the semiconductor element is radiated to the insulative substrate to prevent the temperature of the semiconductor element from being increased. Thus, the characteristics of the semiconductor element are prevented from being deteriorated.

The present invention is effective particularly in the case of a retaining substrate for mounting a semiconductor element thereon, which is heated to a temperature at which a resist is thermally decomposed. Specifically, the present invention is effective in the case of an optical-concentration type solar cell whose temperature is extremely raised due to an external factor by sunlight which is irradiated, where because the retaining substrate of the present invention has excellent heat-radiating functions, the problems relating to such temperature raise of the solar cell can be effectively solved without using any cooling means.

In the present invention, by using an insulative substrate having excellent heat-radiating property as the insulative retaining substrate, it is possible that heat of the semiconductor element is effectively radiated to the substrate side. In the case of using a insulative retaining substrate constituted by a ceramic material, when said ceramic material comprises an aluminum nitride or the like having a heat conductivity of more than $100W/m \cdot K$, it is it is possible that heat of the semiconductor element is more effectively radiated to the substrate side. Separately, as aforesaid ceramic material, when a ceramic material such as a silicon nitride or an aluminum nitride having a thermal expansion coefficient which is similar to that of a silicon material constituting the semiconductor element which is mounted, the durability of the silicon material is improved. Besides, it is possible that a circuit pattern comprising Cu is directly bonded to a ceramic substrate.

The semiconductor element which is mounted on the retaining substrate of the present invention can include various semiconductor elements for which heat radiation is necessitated upon use. In the case where the semiconductor element is a photovoltaic element used in a solar cell, the photovoltaic element has not only internal heat generation but also temperature raise due to an external factor by sunlight irradiated, and therefore, the temperature of the photovoltaic element is markedly raised upon use. Thus, particularly for the retaining substrate of the photovoltaic element, it is required to have sufficient heat radiation properties. The above-described substrate structure of the present invention sufficiently satisfies this requirement.

In the following, detailed description will be made of each member used in the present invention.

Insulative Retaining Substrate

The insulative retaining substrate in the present invention has functions to retain a semiconductor element which is mounted thereon and perform electrical wiring for the semiconductor element. The retaining substrate may be an IC substrate, a printed circuit base board, or the like. The retaining substrate may comprise a material selected from the group consisting of alumina ($Al_2O_3$), AlN, $Si_3N_4$, beryllias, and other inorganic insulative materials represented by glass. Alternatively, the retaining substrate may comprise a material selected from the group consisting of insulative resins such as epoxy resin, phenol resin, polyimide resin, polyester resin, and Teflon, resin compositions comprising two or more of these insulative resins, and composite insulative materials comprising glass fiber and insulative resin. Besides, the retaining substrate may comprise a metal core substrate, or an iron-based enameled substrate.

The insulative retaining substrate in the present invention may be prepared in accordance with the conventional processing method or procedure adopted in processing an insulative substrate.

The foregoing surface side structure of the insulative retaining substrate of the present invention, that is, having the uneven shaped portion (a) (having a structure in that the insulative convex shaped portion. (a-i) and the isulative concave shaped portion (a-ii) are alternately arranged so as to neighbor with each other) at a lower portion and the concave shaped portion (b) above the uneven shaped portion (a), may be formed as will be described below.

For instance, in the case where the above structure is formed using a substrate comprising an organic insulative material, the structure may be formed, for example, in the following manner. A member comprising a given insulative resin material is cured to obtain an insulative resin substrate. The resin substrate is subjected to processing by way of cutting by means of a drill or it is subjected to processing by way of heat press to form a prescribed pattern. In the case of using a resin member which is yet cured, it is possible adopt the following manner. That is, a plurality of prepreg sheets are provided. Some of them are subjected to processing by way of drilling. These prepreg sheets are laminated to form a stacked body comprising hole-bearing prepreg sheets and hole-less prepreg sheets. The stacked body is subjected to a heat treatment to obtain an insulative substrate having a prescribed pattern therein.

In the case of using a ceramic member which is yet cured, it is adopt the following manner. That is, the ceramic member is subjected to processing by way of laser machining to obtain an insulative substrate having a prescribed pattern therein. In the case of using a cured ceramic member, it is possible to adopt the following manner. That is, a plurality of green sheets are provided. Some of them are subjected to processing by way of drilling. These green sheets are laminated to form a stacked body comprising hole-bearing green sheets and hole-less green sheets. The stacked body is subjected to a heat treatment to obtain an insulative substrate having a prescribed pattern therein.

The insulative retaining substrate of the present invention is desired to comprise an insulative material having excellent heat-radiating property. For instance, when the substrate is constituted by an organic insulative material, it is possible to make the organic material have a high heat conductivity in a range of 1 to several tens W/m·k by incorporating a material selected from the group consisting of a powder of a diamond material having a heat conductivity of about 2000 W/m·k, a powder of boron nitride having a heat conductivity of more than 600 W/m·k, a powder of SiC having a heat conductivity of about 240 to 450 W/m·k, a powder of BeO having a heat conductivity of about 240 to 450 W/m·k, a powder AlN powder having a heat conductivity of 100 to 200 W/m·k, a powder of $Si_3N_4$ having a heat conductivity of 30 to 100 W/m·k, and a powder of alumina ($Al_2O_3$) having a heat conductivity of about 20 W/m·k into said organic insulative material. Separately, it is possible that the insulative retaining substrate of the present invention is made to comprise an insulating ceramic substrate prepared using alumina ($Al_2O_3$), AlN, or $Si_3N_4$ while making full use of the advantages of these ceramics having high strength at normal temperature and high temperature, excellent corrosion resistance, hardly wetting property to fused metal, electrical insulation property, and high heat conductivity in accordance in accordance with technique disclosed in Japanese Unexamined Patent Publication No. 117386/1978 or Japanese Unexamined Patent Publication No. 32072/1983. When the insulative retaining substrate of the present invention comprises such ceramic insulative substrate, it is possible to join a copper circuit plate onto the substrate by means of DBC (direct bond copper) method or active metal method. Besides, the substrate has high heat-radiating property, high electrical insulation property, excellent soldering property, bonding property, and copper-adhesion strength. In addition, a large silicon pellet can be directly mounted on the substrate.

Semiconductor Element

As a typical example of the semiconductor element, there can be mentioned a photovoltaic element whose electrode is provided on the substrate side. This is not limitative. The semiconductor element can include hybrit IC, SSR, SCR, and power transistors such as IGBT, which are required to perform heat radiation upon use. These semiconductor elements may be those comprising a single crystal silicon material, a polycrystal silicon material, an amorphous silicon material, or a compound semiconductor material comprising atoms belonging to groups 111 and V of the periodic table. In the case where the semiconductor element is a photovoltaic element whose electrode is provided on the substrate side, namely, on the non-light receiving face side, the thickness of the photovoltaic element is preferred to be thin, specifically, for instance, 200 μm or less. Such thin film semiconductor element (photovoltaic element) may be formed, for example, by a method of cutting a silicon ingot by means of wire-saw to obtain a silicon wafer and subjecting said silicon wafer to a semiconductor-forming treatment.

Circuit Pattern

As previously described, the circuit pattern for a semiconductor element is provided in the insulative concave shaped portion (a-ii) of the uneven shaped portion (a). The circuit pattern functions to output an electric current rectified or generated in the semiconductor element to the outside of the semiconductor element. The circuit pattern can include those used in IC substrates or printed circuit base boards. The circuit pattern is required that it is constituted by a material which excels in soldering property and bonding property and has high adhesion property with the insulative retaining substrate and high electrical conductivity. Such material constituting the circuit pattern can include, for example, metals such Cu, Ni, Mg, Mn, Al, Ag, Au, Pt, Ti, Mo, and W; electrically conductive materials comprising alloys containing these metals; and electrically conductive pastes containing these metals. The circuit pattern may be formed, for instance, by a method wherein a given electrically conductive paste is applied on an appropriate substrate such as a metallized substrate by means of printing technique, the resultant is dried, followed by subjecting to a sintering treatment to form a desired circuit pattern, or a method wherein a given conductor is affixed on an appropriate substrate such as a laminated plate comprising a glass fiber cloth impregnated with epoxy resin and which is coppered, and the conductor layer on the substrate is treated by means of resist patterning, etching, and copper foil-surface treatment to form a desired circuit pattern. The circuit pattern is desired to be of a thickness capable of sufficiently lowering a resistance loss, which is preferably, for instance, in a range of 0.01 to 1 mm.

In the following, the present invention will be described in more detail with reference to examples. It should be understood that these examples are only for illustrative purposes and are not intended to restrict the scope of the present invention.

EXAMPLE 1

FIG. 1 [FIGS. 1(*a*) to 1(*d*)] is a schematic view illustrating the constitution of an example of a retaining substrate for mounting a semiconductor element thereon in the present invention. Specifically, FIG. 1(*a*) is a schematic view illustrating an exterior appearance of said retaining substrate on which a semiconductor element mounted thereon, when viewed from above. FIG. 1(*b*) is a schematic cross-sectional view, taken along the line A–A' in FIG. 1(*a*). FIG. 1(*c*) is a schematic view illustrating a circuit pattern provided in the retaining substrate. FIG. 1(*d*) is a schematic cross-sectional view, taken along the line a–a' in FIG. 1(*c*).

FIGS. 1(*a*) to 1(*d*), reference numeral 1 indicates a solar cell as the semiconductor element, each of reference numerals 2 and 3 an electrode pud, reference numeral 4 a circuit pattern, reference numeral 5 a retaining substrate, reference numeral 11 a concave shaped portion, reference numeral 12 an uneven shaped portion, reference numeral 12*a* a concave shaped portion, and reference numeral 12*b* a convex shaped portion.

The retaining substrate 5 is constituted by a ceramics material containing more than 97 wt. % of AlN (heat conductivity: about 160 W/m·k) and has a thickness of 0.65 mm and a size of 30 mm (width)×32 mm (length).

At a portion of the substrate 5 where the solar cell 1 is arranged, a concave shaped portion 11 having a depth of 0.1 mm is formed by way of laser processing, and under the concave shaped portion 11, there is formed an uneven shaped pattern comprising a plurality of uneven shaped portions 12 arranged so as to neighbor with each other by way of laser processing, wherein each uneven shaped portion comprises a concave shaped portion 12*a* (depth: 0.35 mm) and a convex shaped portion 12*b*. A circuit pattern 4 comprising Cu and having a thickness of 0.3 mm is arranged in each concave shaped portion 12*a*. On the circuit patterns 4 which are arranged in the concave shaped portions 12*a*, electrode puds 2 and 3 of a photovoltaic element are arranged. The circuit patterns 4 are joined with the substrate body 5 by means of DBC method.

In this example, the solar cell 1 comprises an optical-concentration type solar cell comprising two photovoltaic elements formed of a single crystal silicon material and which have a thickness of 0.1 mm and a size of 13 mm×13 mm. At the substrate side (the non-light receiving face side) of each photovoltaic element, a pair of power output electrode puds 2 and 3 are provided. The solar cell 1 is embedded in the concave shaped portion 11 so that the two electrode puds 2 and 3 of each photovoltaic element are situated on and contacted with the corresponding two circuit patterns 4 arranged in the concave shaped portions 12*a* of the uneven shaped pattern situated under the concave shaped portion 11, where the electrode puds 2 and 3 and the circuit patterns 4 are electrically and mechanically connected with each other by means of a solder or an electrically conductive adhesive.

In this example, by embedding the solar cell 1 (comprising the two photovoltaic elements) in the concave portion 11 situated above the uneven shaped pattern comprising the plurality of uneven shaped portions 12 arranged so as to neighbor with each other to perform the positioning, the solar cell 1 (comprising the two photovoltaic elements) can be desirably mounted without the photovoltaic elements being deviated.

EXAMPLE 2

This example shows another example of a retaining substrate for mounting a semiconductor element in the present invention. The retaining substrate is of the constitution which is the same as that in Example 1, except for the following points.

The retaining substrate 5 is constituted by a ceramics material containing more than 96 wt. % of $Al_2O_3$ (heat conductivity: about 20 W/m·k) and has a thickness of 0.65 mm and a size of 30 mm (width)×32 mm (length).

At a portion of the substrate 5 where the solar cell 1 is arranged, a concave shaped portion 11 having a depth of 0.1 mm is formed by way of laser processing, and under the concave shaped portion 11, there is formed an uneven shaped pattern comprising a plurality of uneven shaped portions 12 arranged so as to neighbor with each other by way of laser processing, wherein each uneven shaped portion comprises a concave shaped portion 12*a* (depth: 0.35 mm) and a convex shaped portion 12*b*. A circuit pattern 4 comprising Cu and having a thickness of 0.3 mm is arranged in each concave shaped portion 12*a*. On the circuit patterns 4 which are arranged in the concave shaped portions 12*a*, electrode puds 2 and 3 of a photovoltaic element are arranged. The circuit patterns 4 are joined with the substrate body 5 by means of DBC method.

In this example, the solar cell 1 comprises an optical-concentration type solar cell comprising two photovoltaic elements formed of a single crystal silicon material and which have a thickness of 0.1 mm and a size of 15 mm×15 mm. At the substrate side (the non-light receiving face side) of each photovoltaic element, a pair of power output electrode puds 2 and 3 are provided. The solar cell 1 is embedded in the concave shaped portion 11 so that the two electrode puds 2 and 3 of each photovoltaic element are situated on and contacted with the corresponding two circuit patterns 4 arranged in the concave shaped portions 12*a* of the uneven shaped pattern situated under the concave shaped portion 11, where the electrode puds 2 and 3 and the circuit patterns 4 are electrically and mechanically connected with each other by means of a solder or an electrically conductive adhesive. At this time, portions (where the electrode puds 2 and 3 are not present) of the non-light receiving face of each photovoltaic element of the solar cell 1 are close-contacted with the corresponding convex portion 12b of the uneven shaped pattern situated under the concave shaped portion 11.

In this example, by embedding the solar cell 1 (comprising the two photovoltaic elements) in the concave portion 11 situated above the uneven shaped pattern while close-contacting the portions (where the electrode puds 2 and 3 are not present) of the non-light receiving face of each photovoltaic element of the solar cell 1 with the corresponding convex portion 12b of the uneven shaped pattern situated under the concave shaped portion 11, the solar cell 1 (comprising the two photovoltaic elements) can be desirably mounted without the photovoltaic elements being deviated and concurrently with this, heat generated in the solar cell 1 can be more efficiently radiated to the substrate body side.

A different point between Example 2 and Example 1 is that there is present a clearance between the substrate and a portion (where the electrode puds 2 and 3 of the non-light receiving face of each photovoltaic element of the solar cell 1 in Example 1 but in Example 2, the non-light receiving face of each photovoltaic element of the solar cell 1 is entirely contacted with the substrate 5. There is also a difference between Example 1 and Example 2, in that the heat conductivity of the substrate 5 in Example 1 is larger than that in Example 2.

Separately, in each of Examples 1 and 2, sunlight condensed to about 30 times was irradiated to the solar cell 1 mounted on the substrate 5 and the temperature of the solar cell was measured. As a result, the temperature of the solar cell was found to be 78° C. in each case. On the other hand, the temperature in the substrate structure in Comparative Example which will be described later was found to be 83° C.

Incidentally, in order to improve the heat-radiating characteristics to the substrate body side, it is effective to improve the adhesion between the portion (where the electrode puds 2 and 3 are not present) of the non-light receiving face of the photovoltaic element and the contact portions of the substrate. It is possible to provide a insulative resin layer having a high heat conductivity at the contact portion of the substrate.

Comparative Example

Figure 2A:
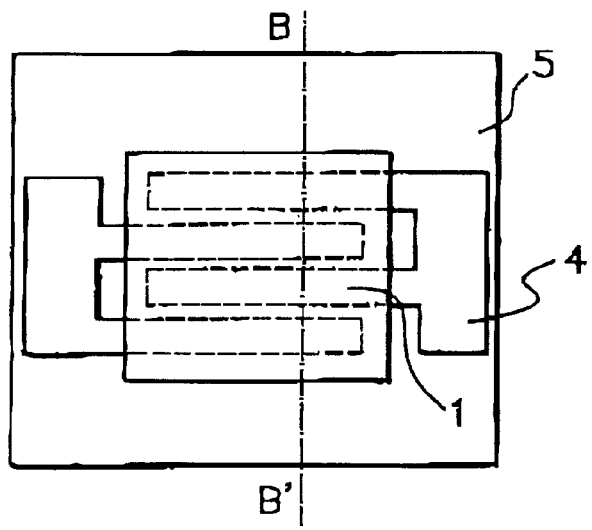
FIGS. 2(a) to 2(d) are schematic views illustrating an example of a retaining substrate for mounting a semiconductor element thereon and an example of a configuration in that said semiconductor element is mounted on said substrate, relating to Comparative Example which will be described later.
Figure 2B:
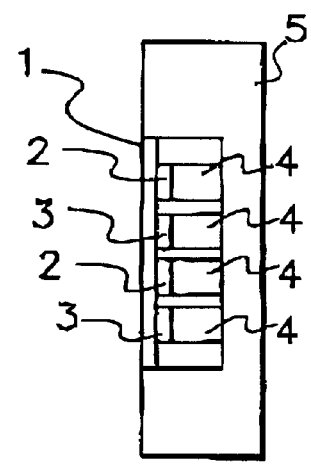
Figure 2C:
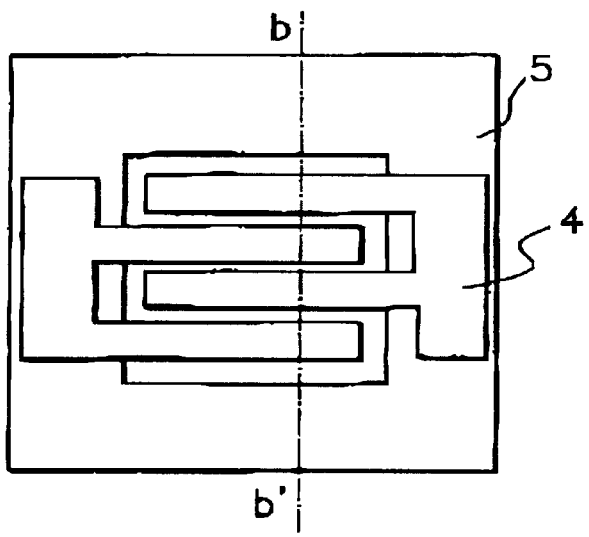
Figure 2D:
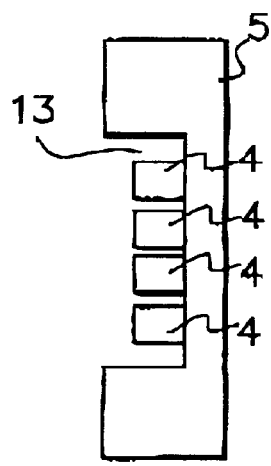
Figure 3:
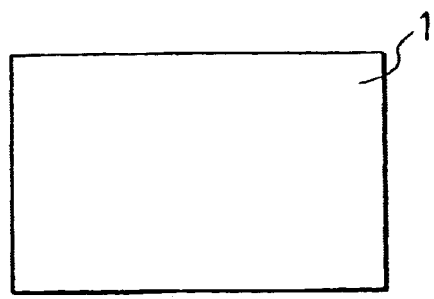
FIGS. 3(a) to 3(d) are schematic views illustrating the constitution of an example of an optical-concentration type solar cell.
Figure 3:
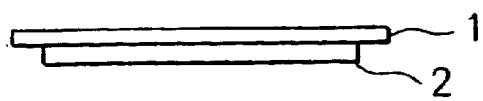
Figure 3:
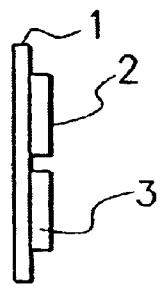
Figure 3:
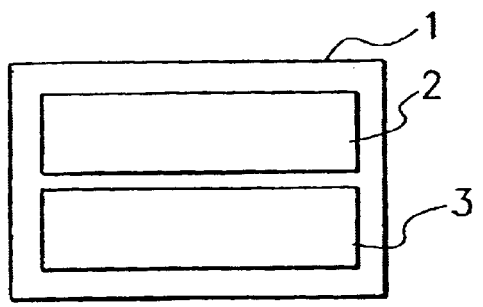
Figure 4:
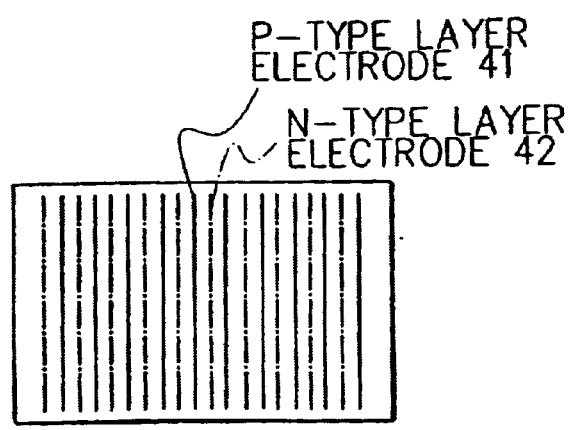
FIG. 4 is a schematic view illustrating the constitution of a photoelectric conversion layer having a plurality of p-n junction structures used in the optical-concentration type solar cell shown in FIG. 3.
Figure 5:
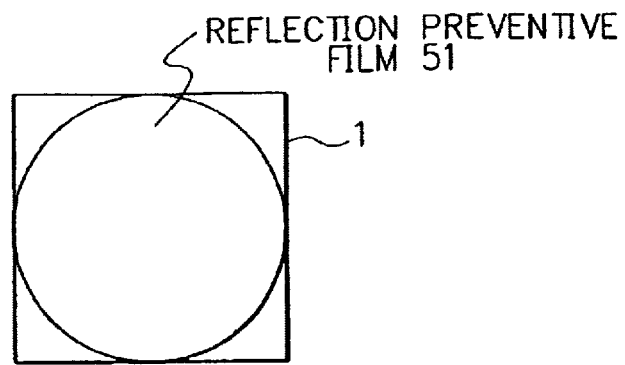
FIGS. 5(a) to 5(d) are schematic views illustrating the constitution of an example of an optical-concentration type solar cell in which condensation of sunlight is performed using a Fresnel lens.
Figure 5:
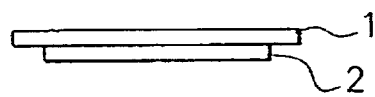
Figure 5:
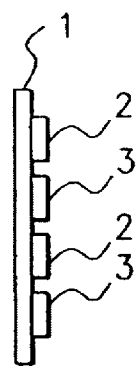
Figure 5:
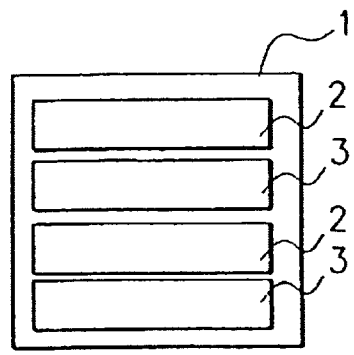
Figure 6:
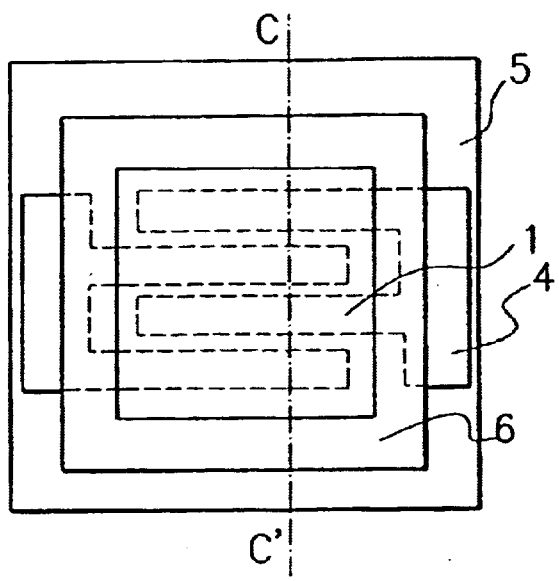
FIGS. 6(a) to 6(c) are schematic views illustrating an example of a solar cell mounted on a retaining substrate.
Figure 6:
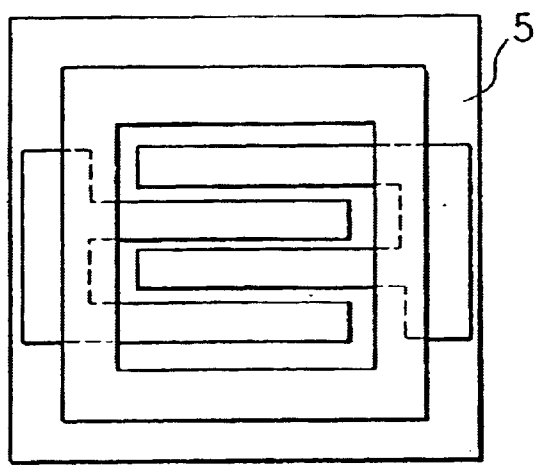
Figure 6:
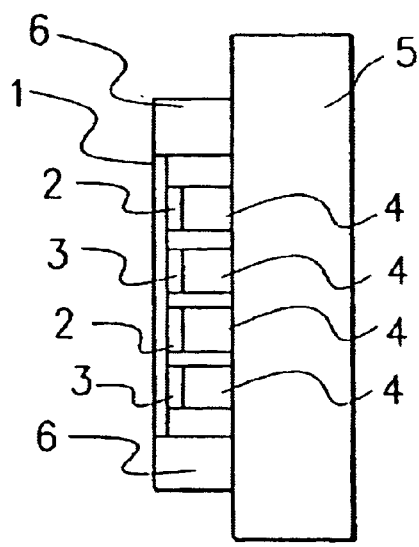

FIG. 2 [FIGS. 2(a) to 2(d)] is a schematic view illustrating the constitution of a retaining substrate and a state after a semiconductor element is mounted thereon. Specifically, FIG. 2(a) is a schematic view illustrating an exterior appearance of said retaining substrate, when viewed from above. FIG. 2(b) is a schematic cross-sectional view, taken along the line B–B' in FIG. 2(a). FIG. 2(c) is a schematic view illustrating a circuit pattern provided in the retaining substrate. FIG. 2(d) is a schematic cross-sectional view, taken along the line b–b' in FIG. 2(c).

FIGS. 2(a) to 2(d), reference numeral 1 indicates a solar cell as the semiconductor element, each of reference numerals 2 and 3 an electrode pud, reference numeral 4 a circuit pattern, reference numeral 5 a retaining substrate, and reference numeral 13 a concave shaped portion of the substrate 5.

The retaining substrate 5 is constituted by a ceramics material containing more than 96 wt. % of $Al_2O_3$ (heat conductivity: about 20 W/m·k) and has a thickness of 0.65 mm and a size of 30 mm (width)×32 mm (length).

At a portion of the substrate 5 where the solar cell 1 is arranged, a concave shaped portion 13 having a depth of 0.45 mm is formed by way of laser processing. A plurality of circuit patterns 4 comprising Cu and having a thickness of 0.3 mm are arranged at prescribed respective portions in the concave shaped portion 13. On the circuit patterns 4 which are arranged in the concave shaped portions 13, electrode puds 2 and 3 of a photovoltaic element are arranged. The circuit patterns 4 are joined with the substrate body 5 by means of DBC method.

In this comparative example, the solar cell 1 comprises an optical-concentration type solar cell comprising two photovoltaic elements formed of a single crystal silicon material and which have a thickness of 0.1 mm and a size of 15 mm×15 mm. At the substrate side (the non-light receiving face side) of each photovoltaic element, a pair of power output electrode puds 2 and 3 are provided. The solar cell 1 is embedded in the concave shaped portion 13 so that the two electrode puds 2, and 3 of each photovoltaic element are situated on and contacted with the corresponding two circuit patterns 4 arranged in the concave shaped portions 13, where the electrode puds 2 and 3 and the circuit patterns 4 are electrically and mechanically connected with each other by means of a solder or an electrically conductive adhesive.

In this example, by embedding the solar cell 1 (comprising the two photovoltaic elements) in the concave portion 13 while positioning the photovoltaic elements of the solar cell, the solar cell 1 (comprising the two photovoltaic elements) can be mounted while preventing the photovoltaic elements from being deviated.

As described in the above, the retaining substrate for mounting a semiconductor element thereon in the present invention has the uneven shaped portion (a) having a structure in that the insulative convex shaped portion (a-i) and the isulative concave shaped portion (a-ii) are alternately arranged so as to neighbor with each other at a lower portion thereof and has the concave shaped portion (b) above the uneven shaped portion (a). In more detail, the uneven shaped portion (a) has a structure in that a plurality of insulative concave shaped portions (a-ii) each circumscribed by an insulative convex shaped portion (a-i) are arranged to neighbor with each other. A circuit pattern for a semiconductor element is provided in each insulative concave shaped portion (a-ii) and an electrode of a semiconductor element is arranged on the circuit pattern situated in the insulative concave shaped portion (a-ii) such that said electrode is close-contacted with the circuit pattern while being electrically connected with the circuit pattern where the insulative convex shaped portion (a-i) is present between each adjacent insulative concave shaped portions (a-ii). The semiconductor element is arranged in the concave shaped portion (b) situated above the uneven shaped portion (a), where the semiconductor element is close-contacted with the insulative convex shaped portion (a-i) of the uneven shaped portion (a) situated below the concave shaped portion (b) and simultaneously with this, the semiconductor element is close-contacted with the substrate body.

The retaining substrate of the present invention which has such specific structure as above described has significant advantages as will be described below.

It is possible to effectively and desirably mount a semiconductor element having an electrode on the substrate side thereof on the retaining substrate without using a resist (which is inferior in terms of the heat resistance) which is used in the prior art and while preventing occurrence of positional shift of the semiconductor element upon mounting it on the substrate.

It is also possible that heat of the semiconductor element is radiated to the insulative substrate to prevent the temperature of the semiconductor element from being increased. Thus, the characteristics of the semiconductor element are prevented from being deteriorated.

The retaining substrate is effective particularly in the case of a retaining substrate for mounting a semiconductor element thereon, which is heated to a temperature at which a resist is thermally decomposed. Specifically, the present invention is particularly advantageous to be applied in an optical-concentration type solar cell whose temperature is extremely raised due to an external factor by sunlight which is irradiated, where it is substantially impossible to use a resist, because the retaining substrate has excellent heat-radiating function, when the substrate is used as a retaining substrate of the optical-concentration type solar cell, the problems relating to temperature raise thereof can be effectively solved without using any cooling means.

What is claimed is:

1. A retaining substrate for mounting a semiconductor element thereon, having a circuit pattern for said semiconductor element, characterized in that said substrate comprises an insulative material, said substrate has a surface configuration having a cross section comprising (a) an uneven shaped portion and (b) a concave shaped portion which are arranged in tandem wherein a surface of said uneven shaped portion (a) makes a bottom face of said concave portion (b), and said uneven shaped portion (a) has a structure in that (a-i) an insulative convex shaped portion and (a-ii) an insulative concave shaped portion are alternately arranged so as to neighbor with each other, and said circuit pattern is provided in said concave shaped portion (a-ii) of said uneven shaped portion (a).

2. A retaining substrate according to claim 1, wherein the semiconductor element has an electrode, and said electrode is arranged in the concave shaped portion (a-ii) of the uneven shaped portion (a) to situate on and close-contact with the circuit pattern provided in the concave shaped portion (a-ii) while the electrode being electrically connected with the circuit pattern.

3. A retaining substrate according to claim 1, wherein the semiconductor element is arranged in the concave shaped portion (b) and the semiconductor element is close-contacted with an insulative portion of the insulative convex shaped portion (a-i) of the uneven shaped portion (a).

4. A retaining substrate according to claim 1, wherein the semiconductor element has an electrode, said electrode of the semiconductor element is arranged in the concave shaped portion (a-ii) of the uneven shaped portion (a) to situate on and close-contact with the circuit pattern provided in the concave shaped portion (a-ii) while the electrode being electrically connected with the circuit pattern, the semiconductor element is arranged in the concave shaped portion (b) and the semiconductor element is close-contacted with an insulative portion of the insulative convex shaped portion (a-i) of the uneven shaped portion (a).

5. A retaining substrate according to claim 1, wherein said retaining substrate has excellent heat-radiating function.

6. A retaining substrate according to claim 1, wherein said retaining substrate has no resist thereon.

7. A retaining substrate according to claim 1, wherein the semiconductor element is a photovoltaic element.

8. A semiconductor device comprising an insulative substrate and a semiconductor element provided on said substrate, said semiconductor element having an electrode, characterized in that said substrate has an uneven shaped portion (a) in that an insulative convex shaped portion (a-i) and an isulative concave shaped portion (a-ii) are alternately arranged so as to neighbor with each other at a lower portion thereof and has a concave shaped portion (b) situated above said uneven shaped portion (a), a circuit pattern for said semiconductor element and said electrode of said semiconductor element are arranged in this order in said insulative concave shaped portion (a-ii) of said uneven shaped portion (a) such that said circuit pattern and said electrode are close-contacted with each other while being electrically connected with each other, and said semiconductor element is arranged in said concave shaped portion (b) situated above said uneven shaped portion (a) while being close-contacted with said insulative convex shaped portion (a-i) of said uneven shaped portion (a) and while being close-contacted with the substrate body.

9. A semiconductor device according to claim 8, wherein the semiconductor element is a photovoltaic element.

* * * * *

UNITED STATES PATENT AND TRADEMARK OFFICE
CERTIFICATE OF CORRECTION

PATENT NO.     : 6,664,597 B2
DATED          : December 16, 2003
INVENTOR(S)    : Takeyama et al.

It is certified that error appears in the above-identified patent and that said Letters Patent is hereby corrected as shown below:

Column 1,
Line 13, "a" should read -- an --;
Line 38, "have" should be deleted; and
Line 52, "in disclosed" should be deleted.

Column 2,
Line 31, "fin" should read -- fan --.

Column 3,
Line 28, "irradiated;" should read -- irradiated, --; and
Line 67, "provide" should read -- provided --.

Column 4,
Line 58, "6 used" should read -- 6 is used --.
Line 59, "6 accomplishes" should read -- 6, it accomplishes --.

Column 5,
Line 36, "isulative" should read -- insulative --.

Column 6,
Line 27, "isulative" should read -- insulative --.

Column 7,
Line 31, "isulative" should read -- insulative --; and
Line 64, "amounting" should read -- mounting --.

Column 8,
Line 47, "it is" (second occurrence) should be deleted.

Column 9,
Line 32, "portion. (a-i)" should read -- portion (a-i) -- and "isulative" should read -- insulative --;
Line 46, "adopt" should read -- to adopt --; and
Line 54, "is adopt" should read -- is possible to adopt --.

UNITED STATES PATENT AND TRADEMARK OFFICE
CERTIFICATE OF CORRECTION

PATENT NO. : 6,664,597 B2
DATED : December 16, 2003
INVENTOR(S) : Takeyama et al.

It is certified that error appears in the above-identified patent and that said Letters Patent is hereby corrected as shown below:

Column 10,
Line 23, "in accordance" should be deleted.

Column 13,
Line 19, "(where" should read -- ( --;
Line 20, "element" should read -- element) --;
Line 24, "Example 2," should read -- Example 2 --; and
Line 40, "a" should read -- an --.

Column 14,
Line 16, "puds 2 and 3" should read -- puds 2 and 3 --; and
Line 32, "isulative" should read -- insulative --.

Signed and Sealed this

Twenty-first Day of September, 2004

JON W. DUDAS
*Director of the United States Patent and Trademark Office*